(12) United States Patent
Sung

(10) Patent No.: US 6,242,774 B1
(45) Date of Patent: Jun. 5, 2001

(54) POLY SPACER SPLIT GATE CELL WITH EXTREMELY SMALL CELL SIZE

(75) Inventor: Kuo-Tung Sung, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/266,285

(22) Filed: Mar. 11, 1999

Related U.S. Application Data

(63) Continuation-in-part of application No. 09/093,841, filed on May 19, 1998.

(51) Int. Cl.$^7$ .................................................. H01L 29/788
(52) U.S. Cl. ......................... 257/315; 257/316; 257/317; 257/321
(58) Field of Search ..................................... 257/315, 316, 257/317, 321

(56) References Cited

U.S. PATENT DOCUMENTS

| | | |
|---|---|---|
| 4,754,320 * | 6/1988 | Mizutani et al. ..................... 257/315 |
| 4,997,781 | 3/1991 | Tigelaar . |
| 5,063,172 | 11/1991 | Manley . |
| 5,143,860 | 9/1992 | Mitchell et al. . |
| 5,379,255 | 1/1995 | Shah . |
| 5,457,652 * | 10/1995 | Brahmbhatt ........................... 257/315 |
| 5,476,801 | 12/1995 | Keshtbod . |
| 5,587,332 | 12/1996 | Chang et al. . |
| 5,614,747 | 3/1997 | Ahn . |
| 5,683,923 | 11/1997 | Shintzu . |
| 5,702,965 | 12/1997 | Kim . |
| 5,707,897 | 1/1998 | Lee et al. . |
| 5,923,978 | 7/1999 | Hisamune . |

\* cited by examiner

*Primary Examiner*—Sara Crane
*Assistant Examiner*—Thien F. Tran
(74) *Attorney, Agent, or Firm*—Townsend and Townsend and Crew, LLP

(57) ABSTRACT

A dual-gate cell structure with self-aligned gates. A polysilicon spacer forms a second gate (213) separated from a first gate (201), which is also polysilicon, by a dielectric layer (207). A drain region (219) and a source region (221) are formed next to the gates within a shallower well. The shallower well is positioned above a deep well region. In one embodiment, the second gate (213) acts as a floating gate in a flash cell. The floating gate may be programmed and erased by the application of appropriate voltage levels to the first gate (201), source (221), and/or drain (219). The self-aligned nature of the second gate (213) to the first gate (201) allows a very small dual-gate cell to be formed.

30 Claims, 6 Drawing Sheets

POLY SPACER SPLIT GATE CELL WITH EXTREMELY SMALL CELL SIZE

The present application is a continuation-in-part of U.S. application Ser. No. 09/093,841 filed May 19, 1998, the complete disclosure of which is incorporated herein by reference.

BACKGROUND OF THE INVENTION

The present invention relates to integrated circuits ("ICs"), and more particularly to a split-gate cell, as may be incorporated in an electronically programmable read only memory (EPROM).

Integrated circuits have evolved from a handful of interconnected devices fabricated on a single chip of silicon to millions of devices. Current ICs provide performance and complexity far beyond what was originally imagined. In order to achieve the improvements in complexity and circuit density, i.e., the number of devices capable of being packed onto a given chip area, the size of the smallest device feature, also known as the device "geometry", has become smaller with each generation of ICs. Currently, devices are being fabricated with features less than a quarter of a micron across.

Increasing circuit density has not only improved the complexity and performance of ICs, but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility.

Making devices smaller is very challenging, as each process used in IC fabrication has a limit. That is to say, a given process typically only works down to a certain feature size, and then either the process or the device layout needs to be changed. An example of such a limit is the ability to align one layer of the device to a preceding layer of the device.

Several photolithographic steps are commonly used in the fabrication sequence of an integrated circuit. Photolithography is a process that uses a "mask" to expose selected portions of the surface of the wafer or substrate to light, which is shined through the clear portions of the mask. The surface of the wafer is typically coated with a photoresist, and after exposure of selected portions of the photoresist to the light, the photoresist is developed, so that a patterned layer of photoresist remains on the surface of the wafer. Then, any one of several processes, such as an etch process or an implantation process, may be performed to create a selected pattern on or in the substrate, after which process the photoresist is typically stripped. In some conventional fabrication processes each layer of photoresist or patterned material is aligned to the layer or layers below it.

FIG. 1 is a simplified cross section of a split-gate flash cell that illustrates how the need to align one layer to another can limit the smallest size of the device. A first gate 10 patterned from a first layer of polysilicon is formed on the field oxide 12 of the wafer 20. A dielectric layer 14 is formed over the first gate and then, a second layer of polysilicon is formed over the wafer and patterned to form a second gate 16. The second gate has a channel region 18 and an overlap region 22. The overlap region 22 leaves an exposed portion 24 of the first gate 10 that is not covered by the second gate 16.

It is important to accurately align the pattern of the second polysilicon layer to the pattern of the first polysilicon layer. For example, if the exposed portion 24 of the first gate 10 is too small, the second gate 16 may completely cover the first gate 10 and cell program efficiency will degrade in some circumstances. For example, if the floating gate is programmed with channel hot electrons, the hot carrier energy will degrade because $V_{DS}$ will be divided between the first and second polysilicon gaps. If the overlap region 22 is too small, the first gate 10 and second gate 16 may not properly electrically couple, and if the channel region 18 is too small, the transistor may leak, or there may be no operating channel region at all. Therefore, when aligning the mask that will define the features in the second polysilicon layer, it is important that the edge 26 of the second gate 16 is accurately placed in relation to the first gate 10.

If the sizes of the first gate and second gate are not large enough to accommodate the variation associated with the alignment process, some yield loss will occur due to misalignment. Thus, the dimensions of the first and second gate are typically large enough to be compatible with conventional photomask alignment processes and to provide acceptable yields. However, this may result in device structures that are larger than they need to be for proper circuit operation.

Therefore, it is desirable to provide a multi-gate cell structure that does not require multi-layer alignment of the gates.

SUMMARY OF THE INVENTION

The present invention provides a dual-gate device structure with a small cell size. Such a dual-gate device structure may be used in a split-gate flash cell, for example.

In an exemplary embodiment, a second gate structure is formed by depositing polysilicon over and adjacent to a first gate structure. The second gate structure is separated from the first gate structure by a layer of dielectric material. The second gate is self-aligned to the first gate, so that no photolithographic alignment tolerance is required between these two structures. The first gate and second gate are formed on a substrate having a first conductivity type. First and second well regions are formed within the substrate. Preferably the first well is a deep well having a second conductivity type and the second well is a shallower well having the first conductivity type. Drain and source regions of the second conductivity type are formed in the substrate proximate to the first gate and second gate, separated by a channel region. A dielectric layer separates the first gate from the substrate and a second dielectric layer separates the second gate from the substrate, and a channel region may be formed in the substrate below the gates. In one aspect, the source and drain regions are formed in the shallower well.

The present invention further provides exemplary methods of making a dual-gate device structure with a small cell size. In one exemplary method of forming a non-volatile memory cell, the method includes the step of providing a semiconductor substrate having a first conductivity type. A first region is formed in the substrate having a second conductivity type opposite to the first conductivity type, and a second region is formed in the substrate having the first conductivity type. A first dielectric layer is formed on a surface of the semiconductor substrate. The method includes the step of forming a first conductive layer on the first dielectric layer, and patterning the first conductive layer and first dielectric layer to form a first gate structure separated from the semiconductor substrate by the first dielectric layer, and to form an exposed portion of the surface of the semiconductor substrate A second dielectric layer is formed on a sidewall of the first gate structure and on the exposed portion of the surface of the semiconductor substrate. The method includes forming a second conductive layer on the second dielectric layer, and patterning the second conductive layer to form a first spacer and a second spacer. The first spacer and the second spacer are separated from the first gate structure by the second dielectric layer. The second spacer is removed. A third region is formed in the substrate proximate to an opposite sidewall of the first gate structure and a fourth region is formed in the substrate proximate to an edge of the first spacer. The third region and the fourth region are disposed within the second region and have the second conductivity type.

These and other embodiments of the present invention, as well as its advantages and features are described in more detail in conjunction with the text below and attached figures.

DESCRIPTION OF SPECIFIC EMBODIMENTS

The present invention provides a compact dual-gate structure. Such a structure can be used in a flash memory cell, for example. The second gate is self-aligned to the first gate, which results in a close spacing of the second gate to the first gate that is controlled by the thickness of an intervening dielectric layer. Both the first gate and the second gate are polysilicon. Although the second polysilicon layer is generally formed after the first polysilicon layer, the first and second gates are on approximately the same plane of the structure, or device. No photolithographic alignment tolerance is required between the first and second gates, and therefore the cell size is very small.

It is understood that the term "polysilicon" is used as an example only and includes doped polysilicon, and that the first or second gate may be formed from a variety of materials, including amorphous silicon, recrystallized amorphous silicon, silicon alloys, such as silicides, and other conductive materials, or that a portion of either gate could be one material, with the remainder of the gate being another material or other materials.

FIGS. 2A–2G are simplified cross sections of a portion of an IC 200 after a series of process steps are used to form one embodiment of a device according to the present invention.

Figure 1:
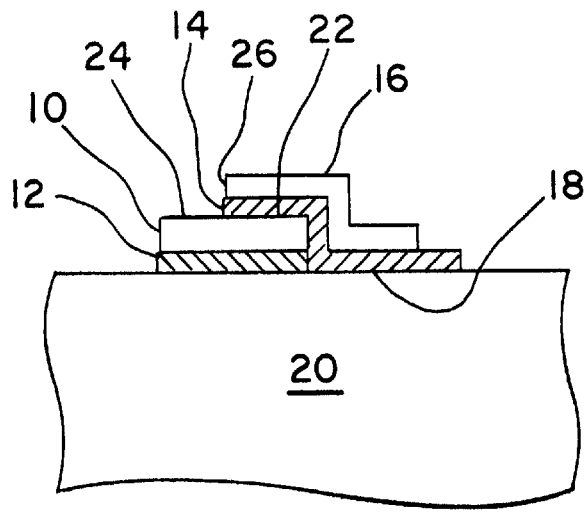
FIG. 1 is a simplified cross section of a split-gate cell with a first polysilicon layer aligned to a second polysilicon layer.
Figure 2A:
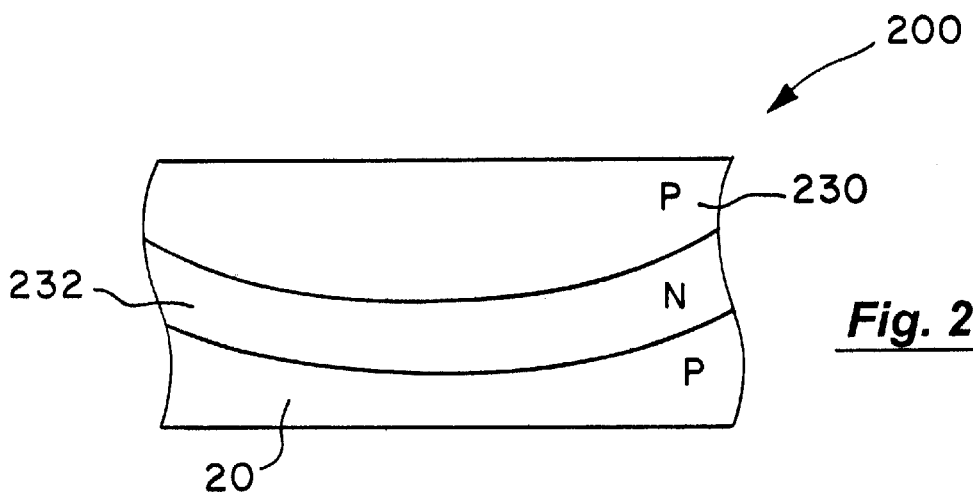
FIGS. 2A–2H are simplified cross sections of a portion of an IC illustrating a series of process steps in accordance with one embodiment of the present invention.
Figure 2I:
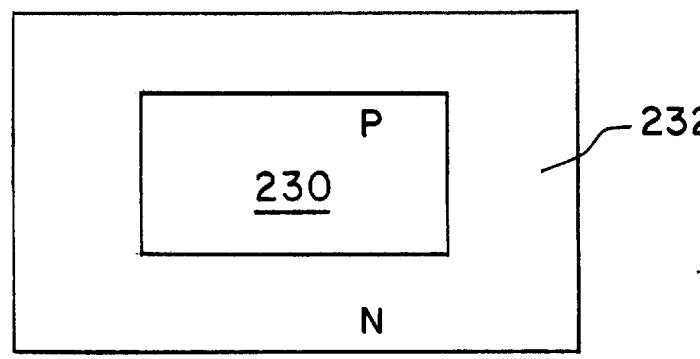
FIG. 2I depicts a simplified top view of an IC after well formation.

FIGS. 2A and 2I are simplified cross section and top views, respectively, of a portion of a semiconductor wafer 20 after well formation. In this instance, the semiconductor wafer 20 is a p-type wafer, but could be an n-type wafer in another embodiment, with appropriate changes to other aspects of the device. A shallower well region 230 and a deep well region 232 are formed within wafer 20 using a triple well process. In one aspect, well regions 230, 232 are formed with ion implantation. The depth of well regions 230 and 232 can be established by controlling the implantation energy, and/or dopant levels and/or drive-in times.

Preferably, shallower well region has the same conductivity type as substrate 20 (shown as p-type in FIG. 2A), and deep well region 232 has the opposite conductivity type (shown as n-type). Shallower well region 230 further is positioned above deep well region 232 to provide isolation thereof. By using shallower well region 230 in this manner, a higher source voltage can be used during cell erase (i.e., 9V). Induced reliability issues, typically a concern for erase with hot hole injection or band-to-band injection, are removed. Fowler-Nordheim erase can be used, resulting in improved reliability. Further, IC 200 has advantages of both a stack gate (e.g., small cell size) and a split gate (e.g., no over-erase problem and easier for multi-level cell application).

Figure 2B:
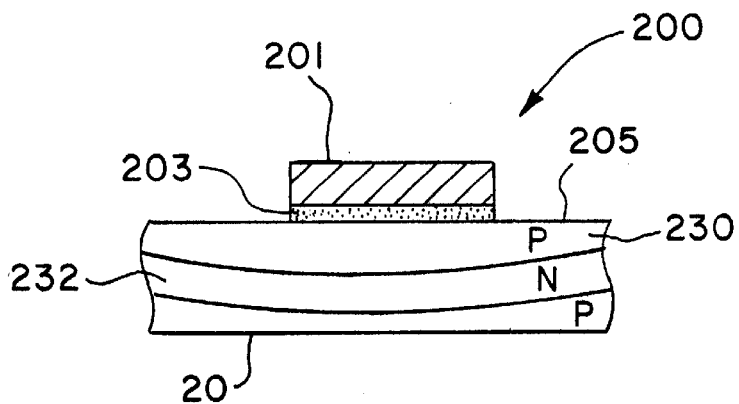

FIG. 2B is a simplified cross section of a first polysilicon gate 201 formed on the semiconductor wafer 20. A gate dielectric layer 203 was formed on the wafer 20 by an oxidation process, but could be formed by other processes, such as a vapor deposition process. The gate dielectric layer 203 is thermally grown silicon oxide and can be grown in the presence of steam, or in the presence of a nitrogen source, such as ammonia. Growing the gate dielectric layer in the presence of a nitrogen source can result in a silicon oxy-nitride layer. It is desirable that the gate dielectric layer be high-quality dielectric so that it withstands the electric fields associated with use. The first gate 201 was formed by depositing a layer of polysilicon over the gate dielectric layer 203 and then patterning the polysilicon. In some embodiments, the gate dielectric layer is not removed from the field 205 of the wafer 20. In other embodiments the polysilicon is partially alloyed with a silicide-forming element, such as platinum.

Figure 2C:
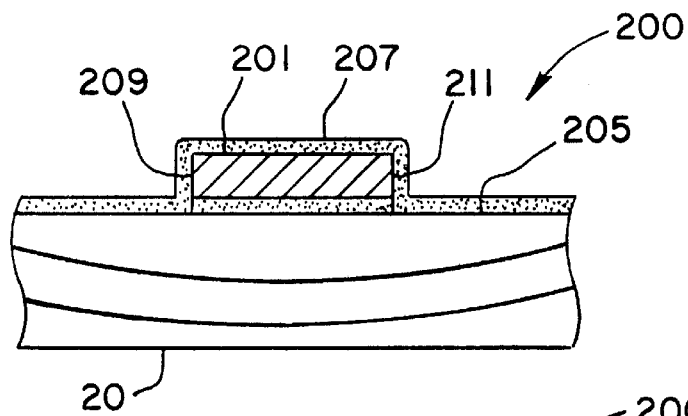

FIG. 2C is a simplified cross section of the portion of an IC 200 after a second dielectric layer 207 has been formed over the first gate 201, including the sidewalls 209, 211 of the first gate 201 and the field 205 of the wafer 20. The second dielectric layer 207 is silicon oxy-nitride formed by a chemical vapor deposition process, but could be other materials, such as silicon oxide, formed by similar or different processes.

Figure 2D:
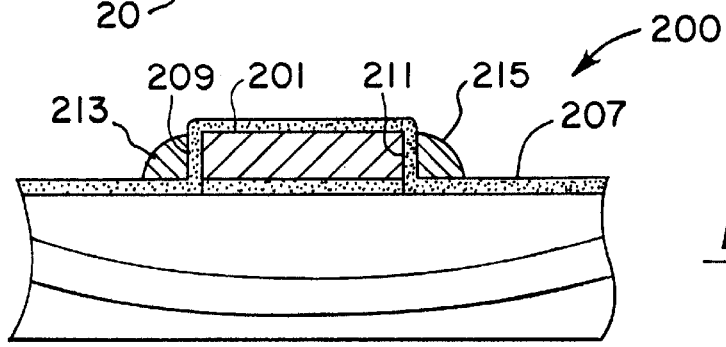

FIG. 2D is a simplified cross section of the portion of an IC 200 after a second layer of polysilicon has been deposited and patterned to form polysilicon spacers 213, 215. The polysilicon spacers 213, 215 are separated from the sidewalls 209, 211 of the first gate 201 by the second dielectric layer 207, and therefore are self-aligned to the first gate, eliminating the need for a photomask alignment tolerance between the first gate and the second gate.

Figure 2E:
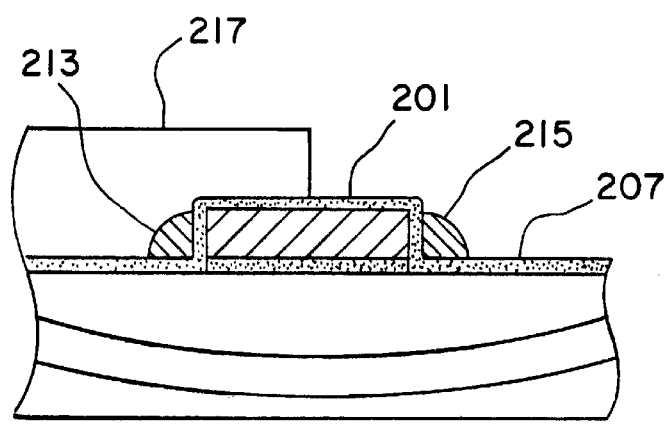

FIG. 2E is a simplified cross section of the portion of an IC with a layer of photoresist 217 over one of the polysilicon spacers 213 and over a portion of the first gate 201. The photoresist 217 has been exposed with a "slop" mask and developed according to the pattern on the mask. A slop mask is a mask that does not require precise alignment to the existing pattern on a wafer. The dielectric layer 207 overlying the first polysilicon layer will serve as an etch barrier in a subsequent silicon etch process to protect the first polysilicon layer when one of the second polysilicon spacers (i.e. 215) is stripped. In addition to the second dielectric layer 207 shown, an additional dielectric layer (not shown) may lie between the second dielectric layer 207 and the first polysilicon layer 201. The additional dielectric layer may be an oxide layer, for example, formed during the polysilicon anneal process or other process and protected by photoresist during the patterning of the first polysilicon layer.

Figure 2F:
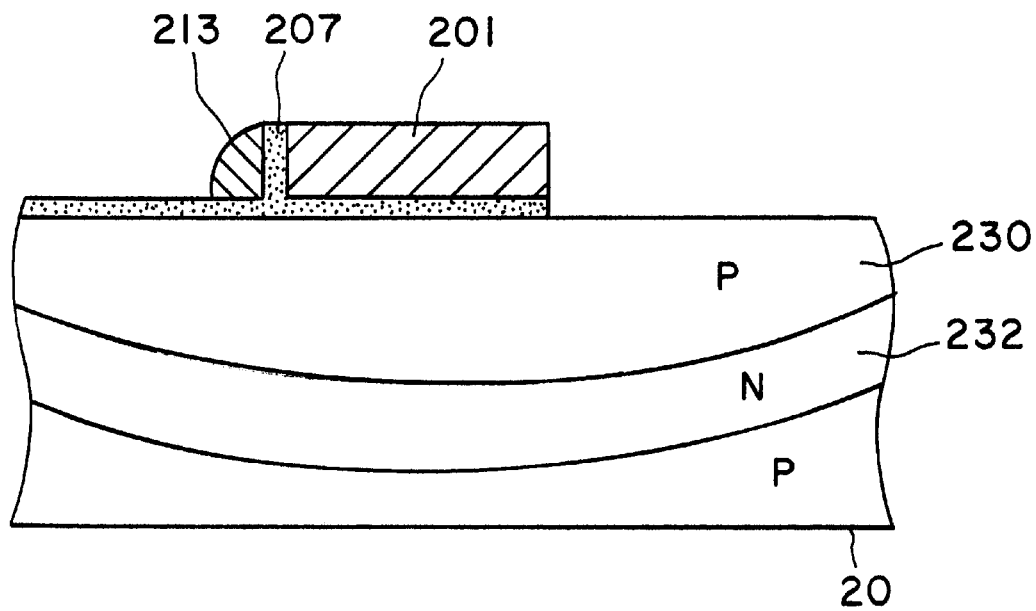

FIG. 2F is a simplified cross section of the portion of an IC after one of the polysilicon spacers has been removed using an etch process. The second polysilicon spacer forms a second gate 213. In one application, the first gate 201 operates as a select gate, or control gate, and the second gate 213 operates as a floating gate. The floating gate preferably is programmed by channel hot electron injection and is erased by Fowler-Nordheim tunneling.

Figure 2G:
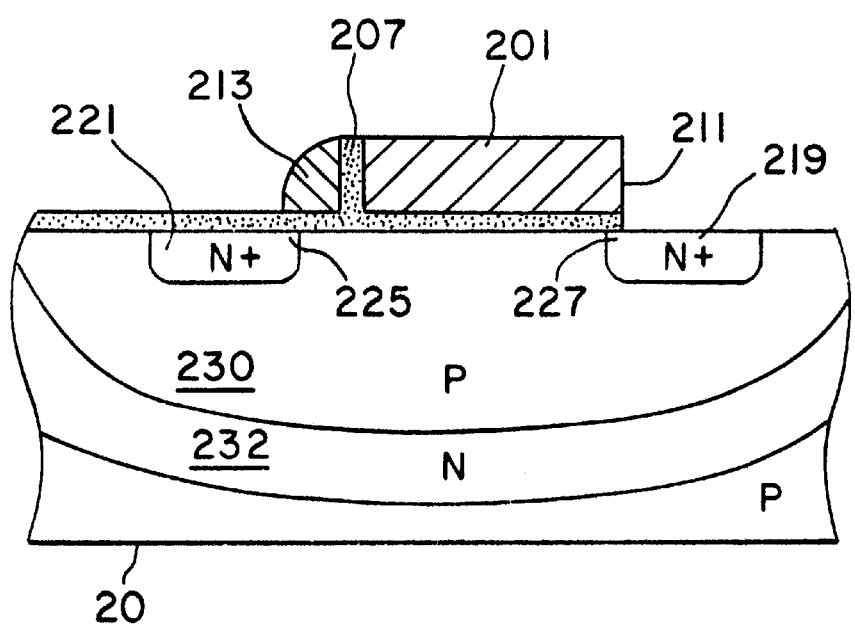

FIG. 2G is a simplified cross section of the portion of an IC with a drain region 219 that was formed by a self-aligned implantation process. The drain region 219 is self-aligned to the sidewall 211 of the first gate. A source region 221 is also formed by ion implantation. It is understood that "source" and "drain" are terms used only as an example and for convenience of reference, and are not intended to limit how the device structure may operate. Thermal treatment after implantation drives some of the source implant 225 under a portion of the second gate, and some of the drain implant 227 under the first gate. In the embodiment shown in FIG. 2G, drain region 219 and source region 221 are disposed within the shallower well region 230.

Figure 2H:
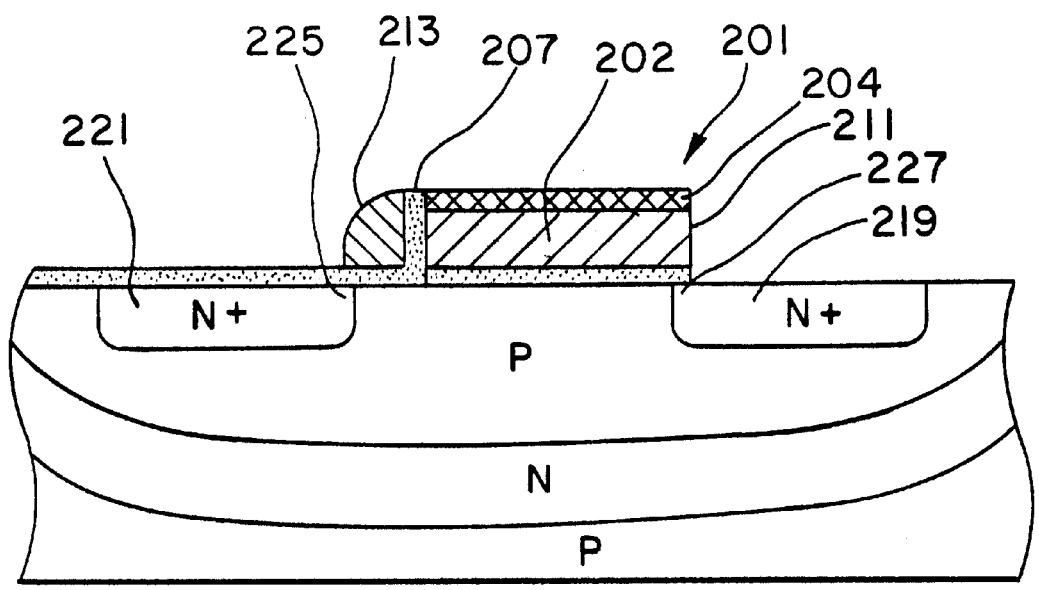

FIG. 2H is a simplified cross section of an alternative embodiment of a portion of an IC with a drain region 219 that was formed by a self-aligned implantation process. The drain region 219 is self-aligned to the sidewall 211 of the first gate. The first gate 201 is made up of a polysilicon region 202 and a polycide region 204. The polysilicon region 202 is formed by depositing amorphous silicon, and then heating the amorphous silicon to form polycrystalline silicon, or by depositing a polysilicon material. A polycide region 204 is formed by depositing a layer of titanium over the polysilicon and heating the first gate region to form titanium silicide.

A source region 221 is also formed by ion implantation. It is understood that "source" and "drain" are terms used only as an example and for convenience of reference, and are not intended to limit how the device structure may operate. Thermal treatment after implantation drives some of the source implant 225 under a portion of the second gate, and some of the drain implant 227 under the first gate.

Figure 3A:
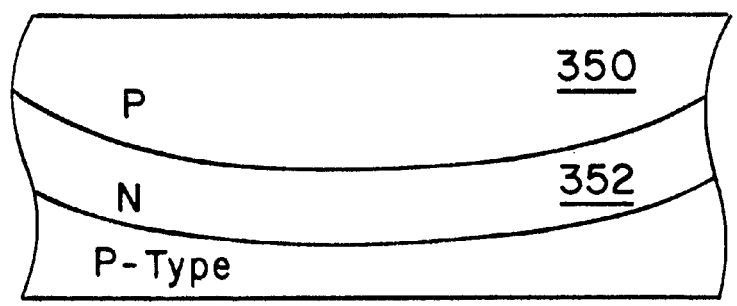
FIGS. 3A–3H are simplified cross sections of a portion of an IC illustrating a series of process steps in accordance with an another embodiment of the present invention.

FIGS. 3A–3H are simplified cross sections of an alternative fabrication process using a polysilicon-fill method. FIG. 3A depicts the semiconductor wafer 20 having a shallower well region 350 and a deep well region 352 implanted therein as previously discussed in conjunction with FIGS. 2A and 2I.

Figure 3B:
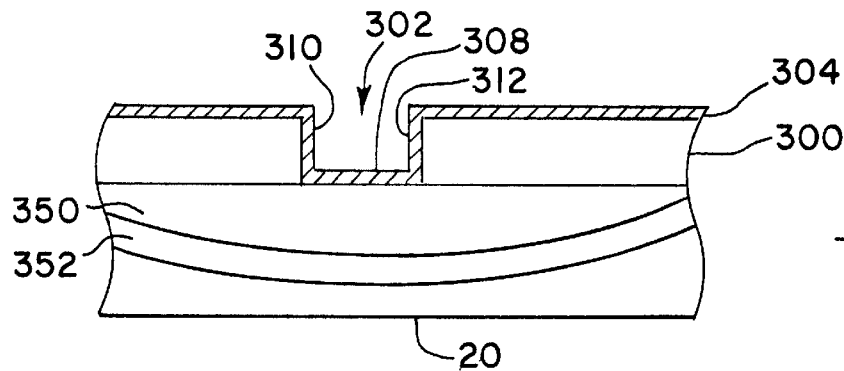

FIG. 3B shows field oxide 300 grown or deposited on wafer 20, and patterned to open a trench 302 where the first gate will be formed. A high-quality dielectric layer 304, in this case silicon nitride, is deposited over the field oxide 300, bottom 308, and sidewalls 310, 312 of the trench 302.

Figure 3C:
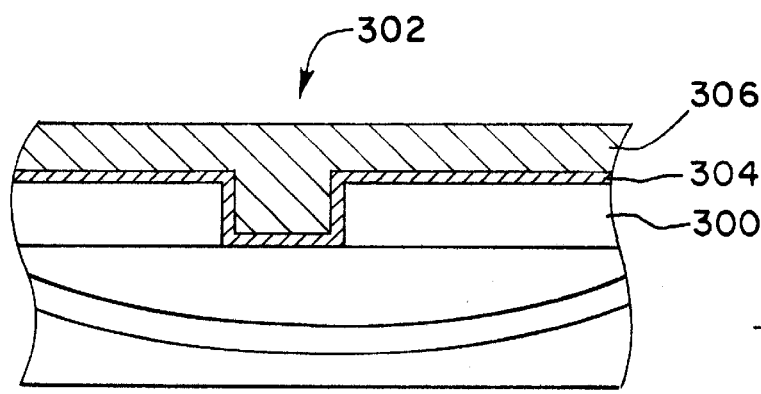
Figure 3D:
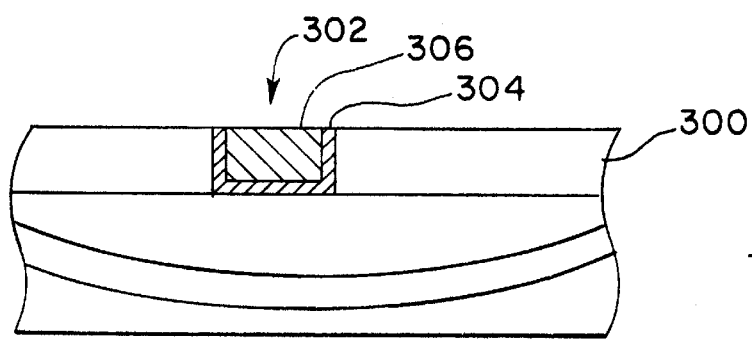

FIG. 3C shows a polysilicon layer 306 deposited to fill the trench and covering the field oxide 300. The polysilicon is then removed from the field oxide 300 along with the high-quality dielectric layer, leaving the trench 302 lined with the high-quality dielectric layer 304 and filled with polysilicon 306, as shown in FIG. 3D.

Figure 3E:
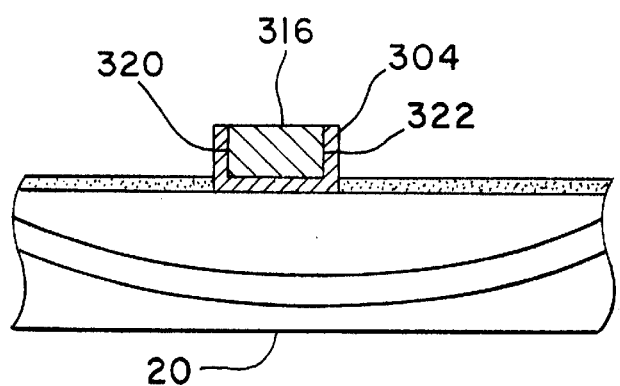

FIG. 3E shows the polysilicon first gate 316 separated from the substrate 20 by the high-quality dielectric layer 304, with the high-quality dielectric layer also covering the sidewalls 320, 322 of the first gate 316 after the field oxide has been stripped. A thin layer of thermal oxide 324 is grown on the substrate, but could be deposited as an alternative. Some oxide may form on the exposed portion of the polysilicon (not shown), but this oxide is easily removed later, if desired.

Figure 3F:
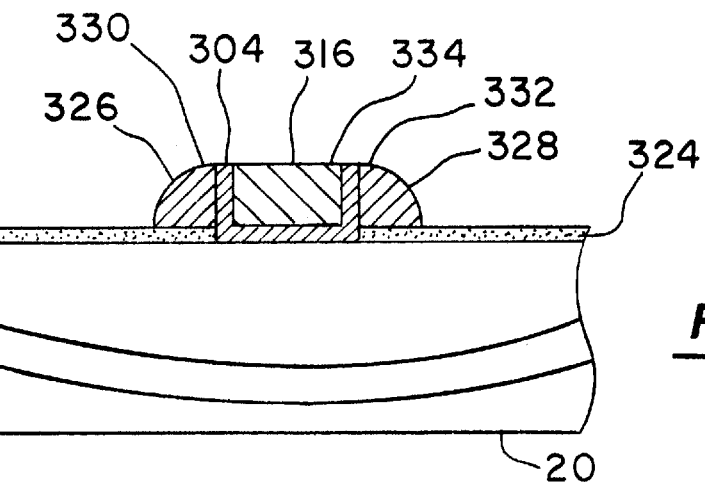
Figure 3G:
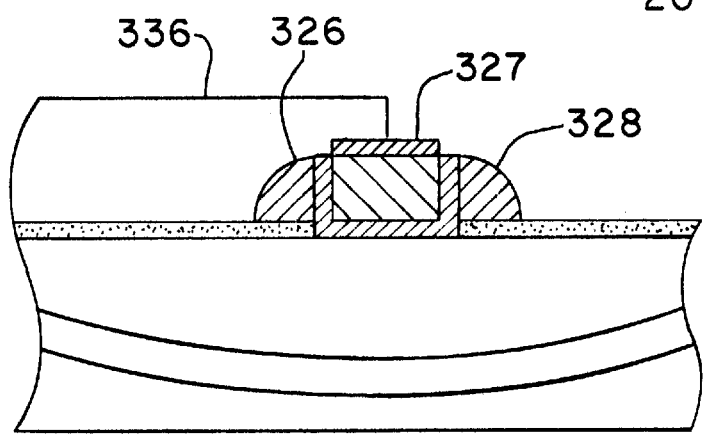

FIG. 3F shows a second layer that has been deposited and patterned to form spacers 326, 328 separated from the first gate 316 by the high-quality dielectric layer 304. The spacers are formed so that the tops 330, 332 of the spacers are approximately the same height from the surface of the substrate as the top 334 of the first gate. A layer of photoresist 336 is applied and developed to cover one of the polysilicon spacers (e.g., spacer 326), leaving the other polysilicon spacer (e.g., spacer 328) exposed so that it may be removed, as shown in FIG. 3G. A layer of dielectric material 327 optionally covers the exposed top surface of the first gate. This layer may be deposited, or preferably grown during a thermal treatment of the first gate. This layer acts as an etch mask for the first polysilicon layer during subsequent processing to remove one of the polysilicon spacers (i.e. 328). This dielectric layer may be left in place or stripped, according to the desired device configuration.

Figure 3H:
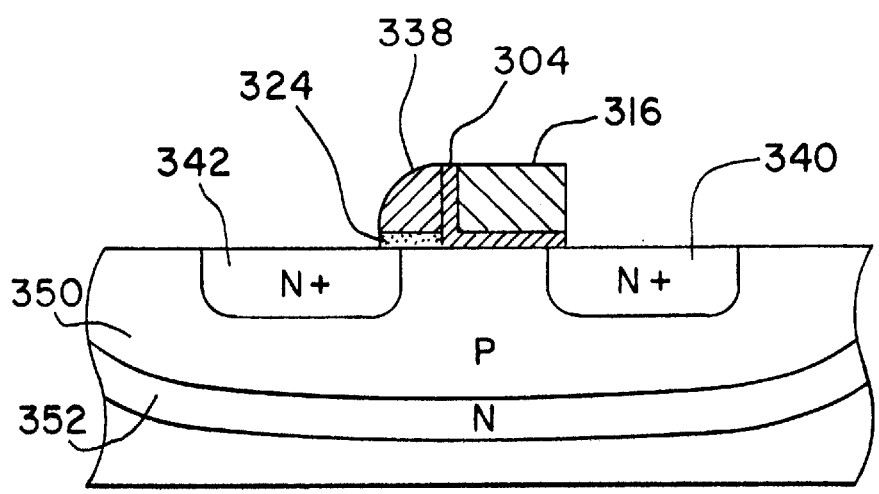

FIG. 3H shows the multiple gate structure after one of the polysilicon spacers has been removed, leaving the other polysilicon spacer as a second gate 338. The second gate 338 is separated from the first gate 316 by the high-quality dielectric layer 304, and is separated from the substrate 20 by the thin layer of thermal oxide 324. A drain region 340 and a source region 342 are implanted, as discussed above. Preferably, drain region 340 and source region 342 are implanted in shallower well region 350 as shown in FIG. 3H.

Examples of typical operating voltages are given in Table 1, below. The descriptions of the physical mechanisms used to program and erase the floating gate are believed to be accurate; however, the actual physical mechanisms may be different or more complicated.

TABLE 1

| Action | $V_{G1}$ | $V_S$ | $V_D$ | Mechanism |
| --- | --- | --- | --- | --- |
| Program | 5 V (Vcc) | 5 V | 0 V | Channel hot electron program |
| Erase | −5 V | 9 V | 9 V | Fowler-Nordheim Tunneling |
| Read | 5 V (Vcc) | 0 V | 2 V | |

While the above is a complete description of specific embodiments of the present invention, various modifications, variations, and alternatives may be employed. For example, the present invention may be applied to other types of wafers, such as silicon-on-insulator wafers, or other types of devices with multiple polysilicon layers formed on approximately the same plane of a device. Other variations will be apparent to persons of skill in the art. These equivalents and alternatives are intended to be included within the scope of the present invention. Therefore, the scope of this invention should not be limited to the embodiments described, and should instead be defined by the following claims.

What is claimed is:

1. A semiconductor device comprising:

a substrate having a first conductivity type and a substrate doping concentration;

a first well region disposed within the substrate, the first well region having a second conductivity type;

a second well region disposed within the substrate, the second well region having the first conductivity type;

a drain region disposed within the substrate, the drain region having the second conductivity type;

a source region disposed within the substrate, the source region having the second conductivity type;

a first dielectric layer disposed between a first gate and the substrate, wherein the first gate has a first sidewall;

a second gate having a second sidewall, the second gate being self-aligned to the first gate by a second dielectric layer disposed between the first sidewall and the second sidewall, said second dielectric layer further disposed between said second gate and said substrate, said second dielectric layer extending at least partially over said source region and exclusive of said drain region, said second dielectric layer comprising different material than said first dielectric layer; and a channel region including a first portion and a second portion disposed in the substrate, said channel region disposed within the second well region and between the drain region and the source region, wherein the first portion of the channel region is separated from a portion of the first gate by the first dielectric layer, and the second portion of the channel region is separated from a portion of the second gate by the second dielectric layer.

2. The semiconductor device structure of claim 1 wherein the first gate comprises polysilicon and the second gate comprises polysilicon.

3. The semiconductor device structure of claim 1 wherein the first gate comprises polycide.

4. The semiconductor device structure of claim 1 wherein the second dielectric layer overlies the first gate.

5. The semiconductor device structure of claim 4 further comprising an additional dielectric layer, the additional dielectric layer being disposed between the second dielectric layer and the first gate.

6. The semiconductor device structure of claim 1 wherein the second dielectric layer comprises material selected from the group consisting of silicon oxide, silicon nitride, and silicon oxy-nitride.

7. The semiconductor device structure of claim 5 wherein the additional dielectric layer comprises material selected from the group consisting of silicon oxide, silicon nitride, and silicon oxy-nitride.

8. The semiconductor device structure of claim 1 wherein the first portion of said channel region is longer than the second portion of said channel region.

9. The semiconductor device structure of claim 1 wherein said first gate and said second gate are in a side-by-side configuration.

10. The semiconductor device of claim 1 wherein said first sidewall and said second sidewall are generally vertical.

11. The semiconductor device of claim 1 wherein said second gate has a third sidewall, said third sidewall having a curved shape.

12. The semiconductor structure of claim 1 wherein the second gate is a floating, gate in a memory cell.

13. The semiconductor structure of claim 1 wherein the first dielectric layer comprises silicon oxide.

14. The semiconductor structure of claim 1, wherein the second well region comprises a shallower well region.

15. The semiconductor structure of claim 1, wherein the first well region is a deep well region below said second well region.

16. The semiconductor structure of claim 1, wherein the second well region is disposed within the first well region, said first well region having a first well region length and a first well region width that are larger than a second well region length and a second well region width, respectively.

17. The semiconductor structure of claim 1, wherein the drain region and the source region are disposed within the second well region.

18. The semiconductor device structure of claim 1 wherein said first dielectric layer comprises silicon oxide, and said second dielectric layer comprises material selected from silicon nitride and silicon oxy-nitride.

19. The semiconductor device structure of claim 1 wherein said first dielectric layer comprises silicon nitride, and said second dielectric layer comprises material selected from silicon oxide and silicon oxy-nitride.

20. The semiconductor device structure of claim 1 wherein said first dielectric layer comprises silicon oxy-nitride, and said second dielectric layer comprises material selected from silicon oxide and silicon nitride.

21. A semiconductor device structure comprising:

a substrate having a first conductivity type and a substrate doping concentration;

a deep well region disposed within the substrate, the deep well region having a second conductivity type;

a shallower well region disposed within the substrate, the shallower well region having the first conductivity type;

a drain region disposed within the shallower well region, the drain region having the second conductivity type;

a source region disposed within the shallower well region, the source region having the second conductivity type;

a first dielectric layer comprising silicon oxide disposed between a first gate and the substrate, wherein the first gate comprises polycide and has a first sidewall;

a second gate comprising polysilicon and having a second sidewall, the second gate being self-aligned to the first gate by a second dielectric layer comprising silicon oxy-nitride disposed between the first sidewall and the second sidewall, and disposed between the second gate and the substrate, said second dielectric extending partially over said source region and exclusive of said drain region; and a channel region including a first portion and a second portion disposed in the shallower well region between the drain region and the source region, wherein the first portion of the channel region is separated from a portion of the first gate by the first dielectric layer, and the second portion of the channel region is separated from a portion of the second gate by the second dielectric layer.

22. A semiconductor device structure comprising:

a substrate having a first conductivity type and a substrate doping concentration;

a first well region disposed within the substrate, the first well region having a second conductivity type;

a second well region disposed within the substrate, the second well region having the first conductivity type;

a drain region disposed within the substrate, the drain region having the second conductivity type;

a source region disposed within the substrate, the source region having the second conductivity type;

a first dielectric layer;

a first gate separated from the substrate by the first dielectric layer, wherein the first gate has a first sidewall and a distal surface distal from the substrate;

a second gate having a second sidewall, the second gate being self-aligned to the first gate by a first portion of the first dielectric layer disposed between the first sidewall and the second sidewall; and a channel region including a first portion and a second portion disposed in the substrate, said channel region disposed within the second well region and between the drain region and the source region, wherein the first portion of the channel region is separated from a portion of the first gate by a second portion of the first dielectric layer, and the second portion of the channel region is separated from a portion of the second gate by a second dielectric layer, said second dielectric layer extending partially over said source region and exclusive of said drain region, said second dielectric layer comprising different material than said first dielectric layer.

23. The semiconductor device structure of claim 22 further comprising a dielectric layer overlying the distal surface of the first gate.

24. The semiconductor device structure of claim 22 wherein the first gate comprises polysilicon and the second gate comprises polysilicon.

25. The semiconductor structure of claim 22 wherein the second gate is a floating gate in a memory cell.

26. The semiconductor structure of claim 22 wherein the first dielectric layer comprises material selected from the group consisting of silicon oxide, silicon nitride, and silicon oxy-nitride.

27. The semiconductor structure of claim 22 wherein the second dielectric layer comprises material selected from the group consisting of silicon oxide, silicon nitride, and silicon oxy-nitride.

28. The semiconductor device structure of claim 22 wherein said first dielectric layer comprises silicon oxide, and said second dielectric layer comprises material selected from silicon nitride and silicon oxy-nitride.

29. The semiconductor device structure of claim 22 wherein said first dielectric layer comprises silicon nitride, and said second dielectric layer comprises material selected from silicon oxide and silicon oxy-nitride.

30. The semiconductor device structure of claim 22 wherein said first dielectric layer comprises silicon oxy-nitride, and said second dielectric layer comprises material selected from silicon oxide and silicon nitride.

* * * * *